US008155419B2

(12) United States Patent
Haider et al.

(10) Patent No.: US 8,155,419 B2
(45) Date of Patent: Apr. 10, 2012

(54) MRI ACQUISITION USING SENSE AND HIGHLY UNDERSAMPLED FOURIER SPACE SAMPLING

(75) Inventors: Clifton R. Haider, Rochester, MN (US); Stephen J. Riederer, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 530 days.

(21) Appl. No.: 12/435,391

(22) Filed: May 4, 2009

(65) Prior Publication Data

US 2009/0238430 A1 Sep. 24, 2009

Related U.S. Application Data

(63) Continuation-in-part of application No. 11/913,429, filed as application No. PCT/US2006/016584 on May 2, 2006.

(60) Provisional application No. 60/677,658, filed on May 4, 2005, provisional application No. 61/049,793, filed on May 2, 2008.

(51) Int. Cl.
*G06K 9/00* (2006.01)
*A61B 5/05* (2006.01)

(52) U.S. Cl. ...................... 382/131; 600/410

(58) Field of Classification Search .................. 324/307, 324/309; 382/128–132; 600/410, 413, 428
See application file for complete search history.

(56) References Cited

U.S. PATENT DOCUMENTS

| 5,084,675 A | 1/1992 | Reinfelder et al. |
| 6,144,874 A * | 11/2000 | Du ................................ 600/413 |
| 2004/0049106 A1 | 3/2004 | Kanazawa |

OTHER PUBLICATIONS

International Search Report and Written Opinion corresponding to PCT/US2006/016584 under date of mailing of May 8, 2007.

* cited by examiner

*Primary Examiner* — Vu Le
*Assistant Examiner* — Amara Abdi
(74) *Attorney, Agent, or Firm* — Quarles & Brady LLP

(57) ABSTRACT

An MRI system produces a three-dimensional image by acquiring NMR signals that fully sample a central region of k-space and partially sample peripheral region of k-space. Specifically, k-space is arranged as a three-dimensional (3D) Cartesian grid of points that is divided into a central region of k-space and a peripheral region of k-space. Points are selected in k-space within a plurality of radial vanes that extend radially outward from the central region of k-space through the peripheral region of k-space as viewed in a plane sampled by two phase encoding gradients to create a plurality of gaps between the radial vanes that is substantially a factor of N times greater in area than the radial vanes. Using an MRI system having arrays of RF receiver coils, NMR signals are acquired from a subject to fully sample the central region of the 3D k-space and undersample the peripheral region of k-space by only sampling k-space within the plurality of radial vanes. An image of the subject is reconstructed using the acquired NMR signals.

10 Claims, 7 Drawing Sheets

MRI ACQUISITION USING SENSE AND HIGHLY UNDERSAMPLED FOURIER SPACE SAMPLING

CROSS-REFERENCE TO RELATED APPLICATIONS

This application is a continuation-in-part of U.S. patent application Ser. No. 11/913,429 filed on Nov. 2, 2007, and entitled "MRI ACQUISITION USING 2D SENSE AND PARTIAL FOURIER SPACE SAMPLING," which is the national-stage filing and claims the benefit of International Application No. US06/016584, filed May 2, 2006 and entitled "MRI ACQUISITION USING 2D SENSE AND PARTIAL FOURIER SPACE SAMPLING," which claims the benefit of U.S. Provisional Patent Application Ser. No. 60/677,658, filed May 4, 2005, and entitled "MRI ACQUISITION USING 2D SENSE AND PARTIAL FOURIER SPACE SAMPLING" and this application is also based on, claims the benefit of, and incorporates herein by reference, U.S. Provisional Patent Application Ser. No. 61/049,793 filed on May 2, 2008, and entitled "METHOD FOR UNDERSAMPLING A 3D CARTESIAN MR IMAGE ACQUISITION."

STATEMENT REGARDING FEDERALLY SPONSORED RESEARCH

This invention was made with government support under Grant No. EB 000212 awarded by the National Institute of Health. The United States Government has certain rights in this invention.

BACKGROUND OF THE INVENTION

The field of the invention is nuclear magnetic resonance imaging (MRI) methods and systems. More particularly, the invention relates to magnetic resonance angiography (MRA) and methods for increasing the acquisition speed of MRA studies.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is a well-known technique that employs a variable amplitude phase encoding magnetic field gradient pulse prior to the acquisition of NMR echo signals to phase encode spatial information in the direction of this gradient. In a two-dimensional implementation (2DFT), for example, spatial information is encoded in one direction by applying a phase encoding gradient (Gy) along that direction, and then an echo signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. In a typical 3DFT pulse sequence spatial information is encoded along two orthogonal axes and the phase encodings ($\Delta G_y$ and $\Delta G_z$) are both stepped through values to sample Fourier space, or "k-space" in a prescribed manner.

There are many other k-space sampling patterns used by MRI systems These include "radial", or "projection reconstruction" (PR) acquisitions in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

MR angiography (MRA) is the application of magnetic resonance imaging methods to the depiction of the human vasculature. The non-invasiveness of MRA makes it a valuable screening tool for cardiovascular diseases. To enhance the diagnostic capability of MRA a contrast agent such as gadolinium can be injected into the patient prior to the MRA scan. Excellent diagnostic images may be acquired using contrast-enhanced MRA (CEMRA) if the data acquisition is properly timed with the bolus passage. Collection of the central lines of k-space during peak arterial enhancement is key to the success of a CEMRA exam. If the central lines of k-space are acquired prior to the arrival of contrast, severe image artifacts can limit the diagnostic information in the image. Alternatively, arterial images acquired after the passage of the peak arterial contrast are sometimes obscured by the enhancement of veins. In many anatomic regions, such as the carotid or renal arteries, the separation between arterial and venous enhancement can be as short as 6 seconds.

The short separation time between arterial and venous enhancement dictates the use of acquisition sequences of either low spatial resolution or very short repetition times (TR). Short TR acquisition sequences severely limit the signal-to-noise ratio (SNR) of the acquired images relative to those exams in which longer TRs are possible. The rapid acquisitions required by first pass CEMRA methods thus impose an upper limit on either spatial or temporal resolution.

Efforts have been made to acquire CEMRA images in shorter scan times using undersampled projection reconstruction scanning methods. As described in U.S. Pat. No. 6,487, 435, it was discovered that image artifacts due to k-space undersampling are unsubstantial when radial acquisitions are used. This is particularly true of CEMRA image frames in which a pre-contrast mask image is subtracted from each acquired image frame.

Many different strategies have been developed to shorten the scan time. In fact, ever since the initial development of MRI in the 1980s there has been considerable interest in methods that are "accelerated" to yield a reduction in acquisition time. One early example is partial Fourier imaging, which is a method that exploits the mathematical symmetry of the MRI data to allow a reduction in the number of phase encoding views that are acquired to sample k-space. One such method is to partially acquire k-space and then calculate the missing data. Such "partial" Fourier data acquisition usually uses Hermitian conjugate symmetry to replace the missing k-space data. Hermitian conjugate symmetry only works if the image is real. Numerous phase errors are present in MRI data that make the image complex. These phase errors result from phenomena such as $B_0$ inhomogeneity, gradient eddy currents, group delays in the gradient amplifiers and receive electronics, and the spatial variation of surface coil receive $B_1$ fields. To enable Hermitian conjugate replacement to work with a complex image, the replacement of the missing k-space data is accompanied by a phase correction that removes the phase errors from this data. One partial Fourier reconstruction algorithm, called "Homodyne reconstruction", uses two filters to accomplish the Hermitian conjugate replacement and the phase correction, respectively. A Homodyne high-pass filter doubles the amplitude of the acquired k-space data which is conjugate to the missing k-space data prior to the Fourier transform. After the Fourier transform, the imaginary part of the image is discarded to complete the replacement step. The phase correction step is accomplished by a Homodyne low pass filter. This filter creates an image from a small portion of k-space data acquired symmetrically around the center of k-space. The phase of this image is subtracted from the phase of the Homodyne high pass filtered image prior to discarding the imaginary part of the image.

Another example of acceleration that is applicable to time-resolved imaging is referred to as "view sharing." View sharing is a technique in which some MR measurements are shared from one reconstructed image to the next, allowing for an image frame rate which is accelerated above normal.

Yet another general method for acceleration exploits the multiple signals obtained if multiple receiver coils are used. Such methods of parallel acquisition or "parallel imaging" allow up to N-fold acceleration for data from N coils. Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils. Thus the use of multiple receiver coils acts to multiply imaging speed, without increasing gradient switching rates or RF power.

Parallel imaging techniques fall into one of two categories. They can fill in the omitted k-space lines prior to Fourier transformation, by constructing a weighted combination of neighboring lines acquired by the different RF detector coils. Or, they can first Fourier transform the undersampled k-space data set to produce an aliased image from each coil, and then unfold the aliased signals by a linear transformation of the superimposed pixel values.

Two such parallel imaging techniques that have been developed and applied to in vivo imaging are SENSE (SENSitivity Encoding) and SMASH (simultaneous acquisition of spatial harmonics). Both techniques include the parallel use of a plurality of separate receiving coils, with each coil having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used.

A number of these "acceleration" methods can be integrated to synergistically provide an acceleration factor higher than what is attainable by any method individually. For example, partial Fourier imaging can be used with SENSE acceleration for a net acceleration factor higher than the number N of coil elements used. Also, view sharing can be used with more frequent sampling of the k-space center to provide an increased frame rate.

As view sharing is carried to an extreme in which case the k-space center is updated far more frequently than peripheral k-space, the averaging of data that occurs over the necessarily long temporal footprint ultimately causes temporal blurring or smearing of time-varying phenomena. Also, as the degree of undersampling of the k-space is made more extensive, the resultant images can have artifactual patterns because of severe undersampling.

It would therefore be desirable to have a system and method for accelerating imaging acquisitions but that does not suffer from the drawbacks of the above-described methods or combinations of drawbacks.

SUMMARY OF THE INVENTION

The present invention overcomes the aforementioned drawbacks by providing a method for undersampling k-space using a an MR pulse sequence that acquires k-space data using a Cartesian sampling pattern but that is designed to have reduced artifacts that are generally considered inherent limitations on undersampled Cartesian sampling patterns. Specifically, artifacts due to undersampling are reduced by fully sampling radially directed vanes along two phase encoded k-space directions and not sampling in the radial gaps therebetween. The amount of undersampling is controlled by the number and width of sampled vanes and the method can be used with other acquisition methods such as parallel imaging. The method is compatible with acceleration methods such as SENSE and partial Fourier.

Also, a method is provided for acquiring three-dimensional MR image data and for reconstructing a three-dimensional image therefrom. More particularly, image data is acquired with a plurality of receive channels using a three-dimensional pulse sequence in which two orthogonal phase encoding gradients are stepped through sets of values to sample three-dimensional k-space in a prescribed pattern. The prescribed pattern includes a central region that is sampled in a centric view order and a peripheral region that is undersampled as a set of radial sectors. An image is reconstructed using a homodyne and a 2D SENSE reconstruction method.

The invention reduces the amount of data that is needed to be acquired for a 3D MR image, so that total scan time can be reduced. This is achieved in part by performing a SENSE acquisition and image reconstruction that enables all of k-space to be undersampled, and in part by a homodyne reconstruction that enables undersampling of the peripheral region of k-space as a set of radial sectors.

The foregoing and other advantages of the inventions will appear in the detailed description that follows. In the description, reference is made to the accompanying drawings.

DESCRIPTION OF THE PREFERRED EMBODIMENT

Figure 1:
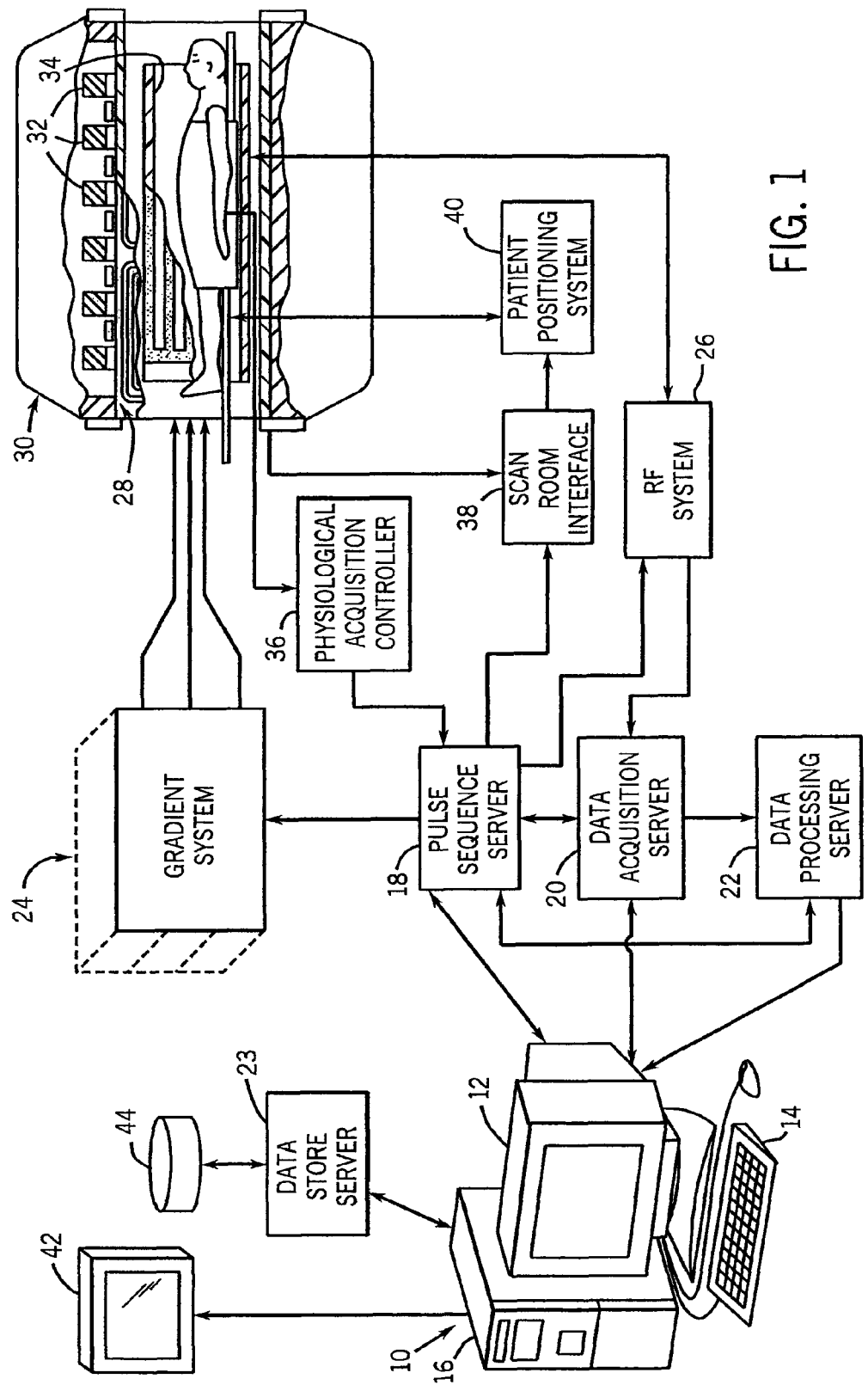
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels and in the preferred embodiment four receiver channels are employed. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

A four-element phased array leg coil is employed to acquire 2D SENSE data. It is a 4-element array with each coil element measuring 40 cm by 15 cm. One pair is placed anterior to the subject's legs and the other pair is placed posterior to the legs. Other leg coils have also been employed which have eight coil elements and it is contemplated that 16 or even 32 element arrays will be used in future embodiments.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
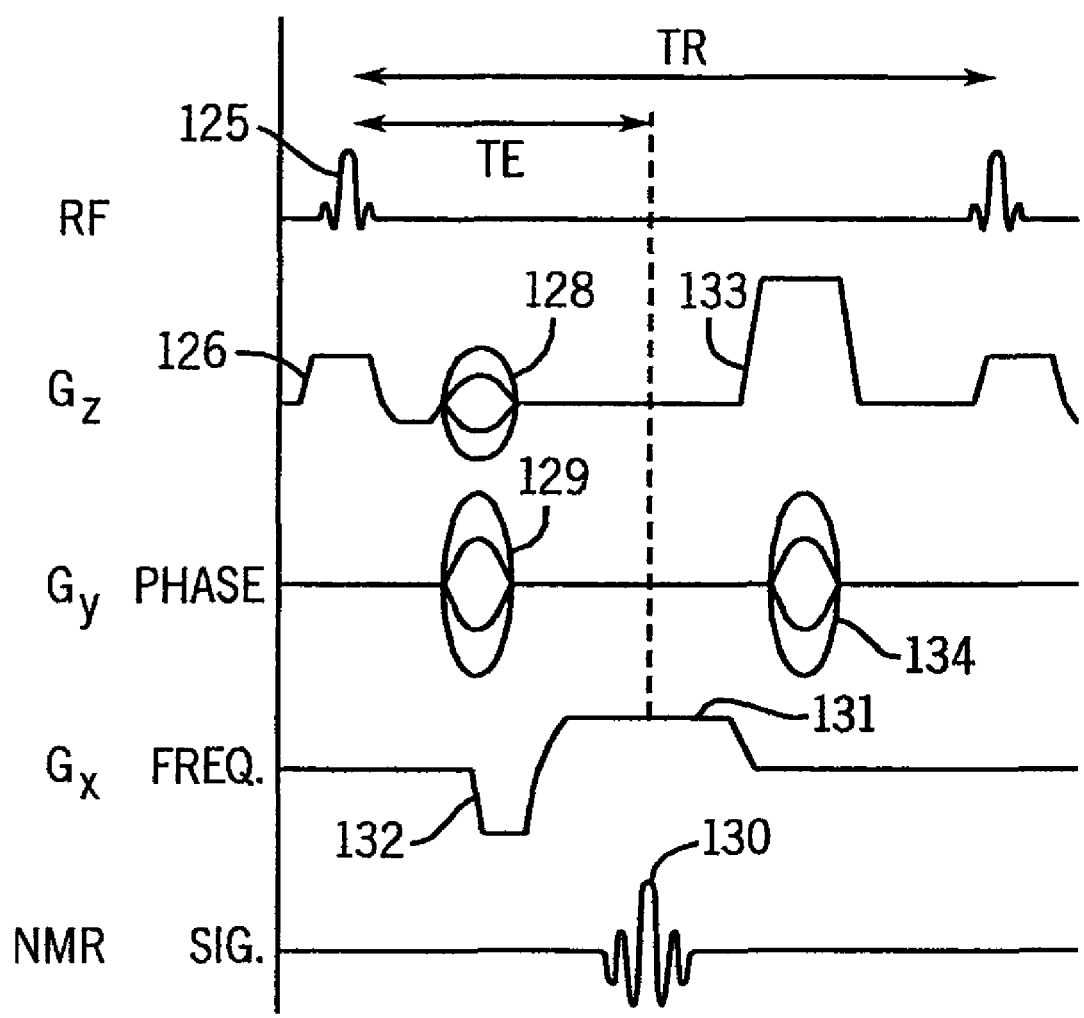
FIG. 2 is a graphic representation of a preferred pulse sequence used to direct the MRI system of FIG. 1.

The NMR system of FIG. 1 performs a series of pulse sequences to collect sufficient NMR data to reconstruct an image. Referring particularly to FIG. 2, an exemplary pulse sequence for conducting a 3 DFT NMR scan is shown. The pulse sequence commences by the selective excitation of the entire region of interest with an RF excitation pulse 125 in the presence of a slab select $G_z$ gradient pulse 126. The frequency content of the excitation pulse 125 and the amplitude of the slab select $G_z$ pulse 126 are selected to produce transverse magnetization in the region which is the subject of the 3D scan. A negative $G_z$ pulse 127 is then produced to rephase the spins in preparation for the phase encoding and readout.

Phase encoding is performed along two axes: the z-axis and the y-axis. The z-axis encoding is accomplished by applying a $G_z$ phase encoding pulse 128 and the y-axis encoding is accomplished by applying a $G_y$ phase encoding pulse 129. As is well-known to those skilled in the art, the magnitude of the phase encoding pulses 128 and 129 are stepped through a series of positive and negative values during the scan, but each is set to one value during each pulse sequence. As will be described in detail below, the order in which these phase encoding pulses 128 and 129 are stepped through their set of values will depend on the particular clinical application of the invention. As is well-known in the art, the magnitude of a phase encoding gradient pulse is determined by the integral of its amplitude over its duration, that is its area. In most pulse sequences the duration is kept constant and the phase encoding pulse magnitude is stepped through its values by changing its amplitude.

After phase encoding the transverse magnetization, the NMR signal 130 is read-out in the presence of a $G_x$ read-out gradient 131. This read-out is preceded by a negative $G_x$ gradient pulse 132 to produce the gradient refocused NMR echo signal 130 in the usual fashion. The 3DFT pulse sequence is then concluded by the application of a large $G_z$ spoiler gradient pulse 133 and a $G_y$ rewinder gradient pulse 134 to prepare the magnetization for the next pulse sequence which follows immediately. As is known to those skilled in the art, the spoiler pulse 133 dephases transverse magnetization and the rewinder pulse 134 refocuses transverse magnetization along the y-axis in preparation for the next pulse sequence. The rewinder pulse 134 is equal in magnitude, but opposite in polarity with the $G_y$ phase encoding pulse 129.

The acquisition of data in 3DFT scanning can be considered sampling of a three-dimensional "k-space". Two of the dimensions, $k_y$ and $k_z$, are sampled by applying different phase encoding gradients $G_y$ and $G_z$ during each pulse sequence of the scan, and each acquired MR signal contains 256 k-space samples along a line in the $k_x$ direction. The pulse sequence is repeated for as many repetitions as are necessary to sample all desired $k_y$ and $k_z$ values. For example, $k_y$ may assume 128 different values and $k_z$ may have 64 values for a fully sampled acquisition of k-space. In this case the number of repetitions of the pulse sequence of FIG. 2 would be 128×64 or 8192.

Figure 3:
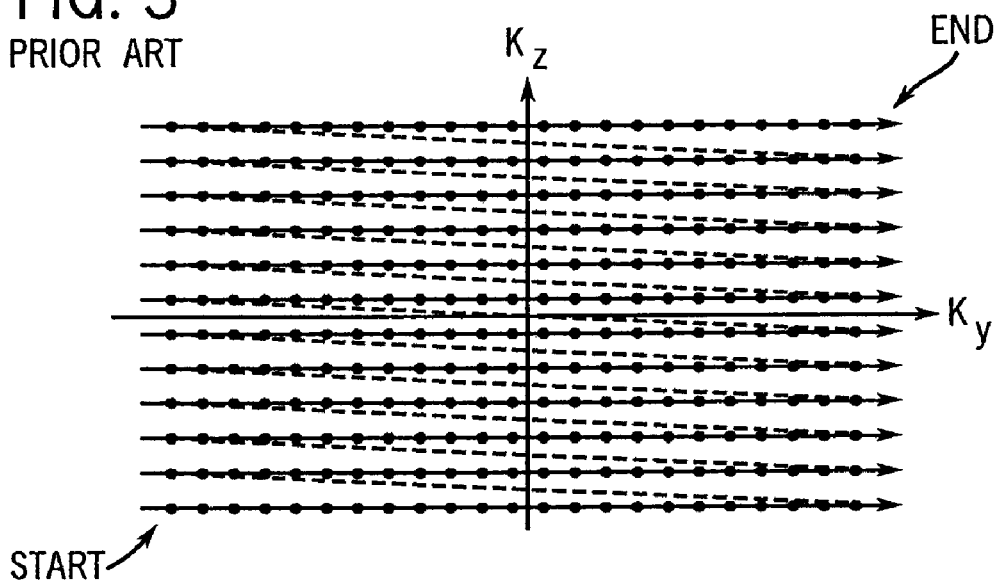
FIG. 3 is a graphic representation of a prior art Cartesian k-space sampling pattern.

With conventional 3DFT scanning the desired values of $k_y$ and $k_z$ are sampled with two nested loops. For example, the inner loop increments ky through its 128 values and after all such samples have been made for a given value of $k_z$, the outer loop increments $k_z$. This process continues until all 128 values of ky have been sampled at each of the 64 values of $k_z$. A diagram of this prior process is shown in FIG. 3, where the vertical axis indicates the sample along $k_z$ produced by the magnitude of the $G_z$ phase encoding pulse, and the horizontal axis indicates the sample along ky produced by the magnitude of the $G_y$ phase encoding pulse. The arrow shows the temporal trajectory through $(k_y, k_z)$ space of the sampling during the scan. The sampling starts in the lower left corner with negative $k_y$ and $k_z$ samples, and ends at the upper right corner with positive $k_y$ and $k_z$ samples. In this conventional scan, therefore, $(k_y, k_z)$ space is scanned in much the same way as a television screen is scanned.

Figure 4:
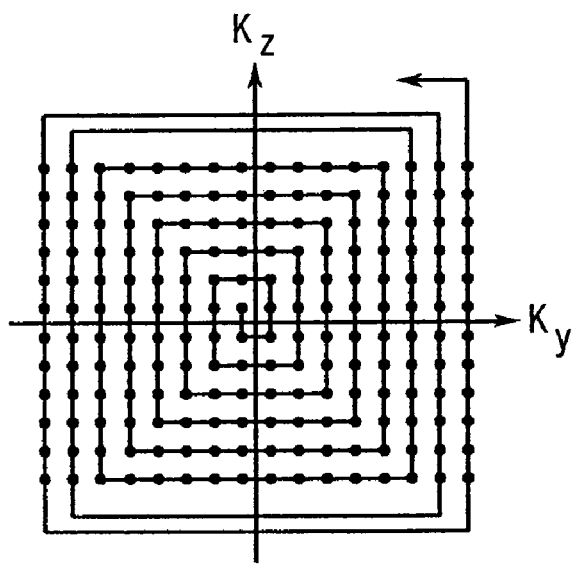
FIG. 4 is a graphic representation of a prior art centric k-space sampling pattern.

Centric view ordering is based on the realization that for most objects the bulk of the signal power is contained in the samples taken near the origin of $(k_y, k_z)$ space, and it is these samples which contribute most significantly to the appearance of the reconstructed image. This results from the fact that the NMR signals acquired during the scan are Fourier transformed along the $k_x$, $k_y$, and $k_z$ directions to produce intensity values for an image in real (x,y,z) space. It is the nature of this transformation that the samples near the origin ($k_y$=0, $k_z$=0) contribute a disproportionate share to the signal power of the reconstructed image. Accordingly, it is a basic idea of centric view ordering to sample the ($k_y$, $k_z$) points which contain the most signal power in as short a time and as close to the beginning of the scan as possible. This can be done by modifying the trajectory with which the ($k_y$, $k_z$) space is sampled. Specifically, a square spiral ($k_y$, $k_z$) trajectory, such as that shown in FIG. 4 may be used. The scan starts at or near the origin of ($k_y$, $k_z$) space and progressively works its way outward in a spiral fashion. In FIG. 4, a 12×16 array of k-space samples are acquired, but this is only illustrative, since in practice many more samples are usually acquired to cover the field of view with adequate resolution.

A second, and more preferred centric view order is the so-called "elliptical centric" view order. This is a view order based on the distance of the sample point from the origin of k-space. First, we assume that the field of view along y is FOV and that the field of view along z is some fraction of this, FOV/N. The $k_y$ values which are to be sampled in the phase encoding process are ±1/(2 FOV), ±3/(2 FOV), ±5/(2 FOV), . . . , ±m/(2 FOV), where m+1 is the total number of ky phase encodes desired. This assumes that the ky origin is not sampled and the smallest nonzero ky spatial frequencies sampled are at ±1/(2 FOV). Similarly the kz values which are to be sampled are ±N/(2 FOV), ±3N/(2 FOV), ±5N/(2 FOV), . . . , ±nN/(2 FOV), where n+2 is the total number of kz phase encodes. All phase encodings to be sampled can then be characterized by the index (i,j), where $-m \leq i \leq m$ and $-n \leq j \leq +n$ and i and j assume nonzero integer values. The distance from the k-space origin to the sample point is characterized by the indices (ij) and is equal to (1/FOV) sqrt $\{[2|i|-1]^2 + N2[2|j|-1]^2\}$ where "sqrt" denotes the operation of taking the square root and |*| denotes absolute value of *. Once the distance is determined for all k-space sample points (i,j), the points are ranked on the basis of their respective distances with the point having the smallest distance being ranked first. In this way, the ordered list of desired phase encodings, or views, is determined and stored for use during a scan in which image data is acquired.

Figure 5:
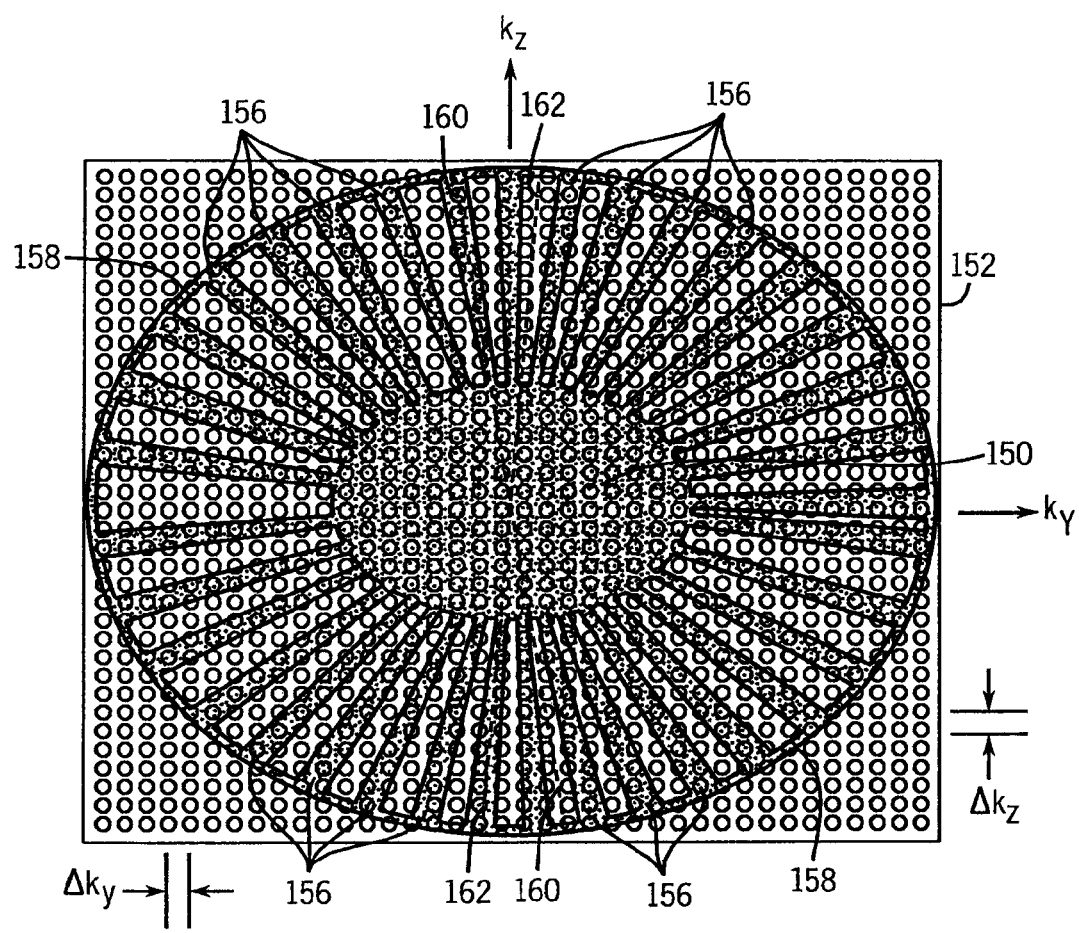
FIG. 5 is a graphic representation of a preferred k-space sampling pattern according to the present invention.

Referring particularly to FIG. 5, the present invention employs a prescribed k-space sampling pattern that employs the elliptical centric view order to sample an elliptical, central region of $k_z$-$k_y$ space as indicated at 150. The prescribed field of view and resolution of the image to be acquired dictates that that $k_z$-$k_y$ space bounded by rectangle 152 be sampled at the grid of sample points indicated by the "O's" for full k-space sampling. According to the present invention, however, this k-space is only partially sampled. Full sampling is done in the central region 150 and only partial sampling is done in peripheral $k_z$-$k_y$ space as indicated by the darkened radial sectors 156 that extend radially outward from the elliptical central region 150. The periphery of the sampled $k_z$-$k_y$ space is defined by an ellipse 158 whose dimensions are determined by $K_z$MAX and $K_y$MAX. The central region occupies from 10% to 20% of k-space and the sampled radial sectors sample 50% of k-space within the outer boundary 158. There is no k-space sampling beyond the outer boundary 158.

Figure 7:
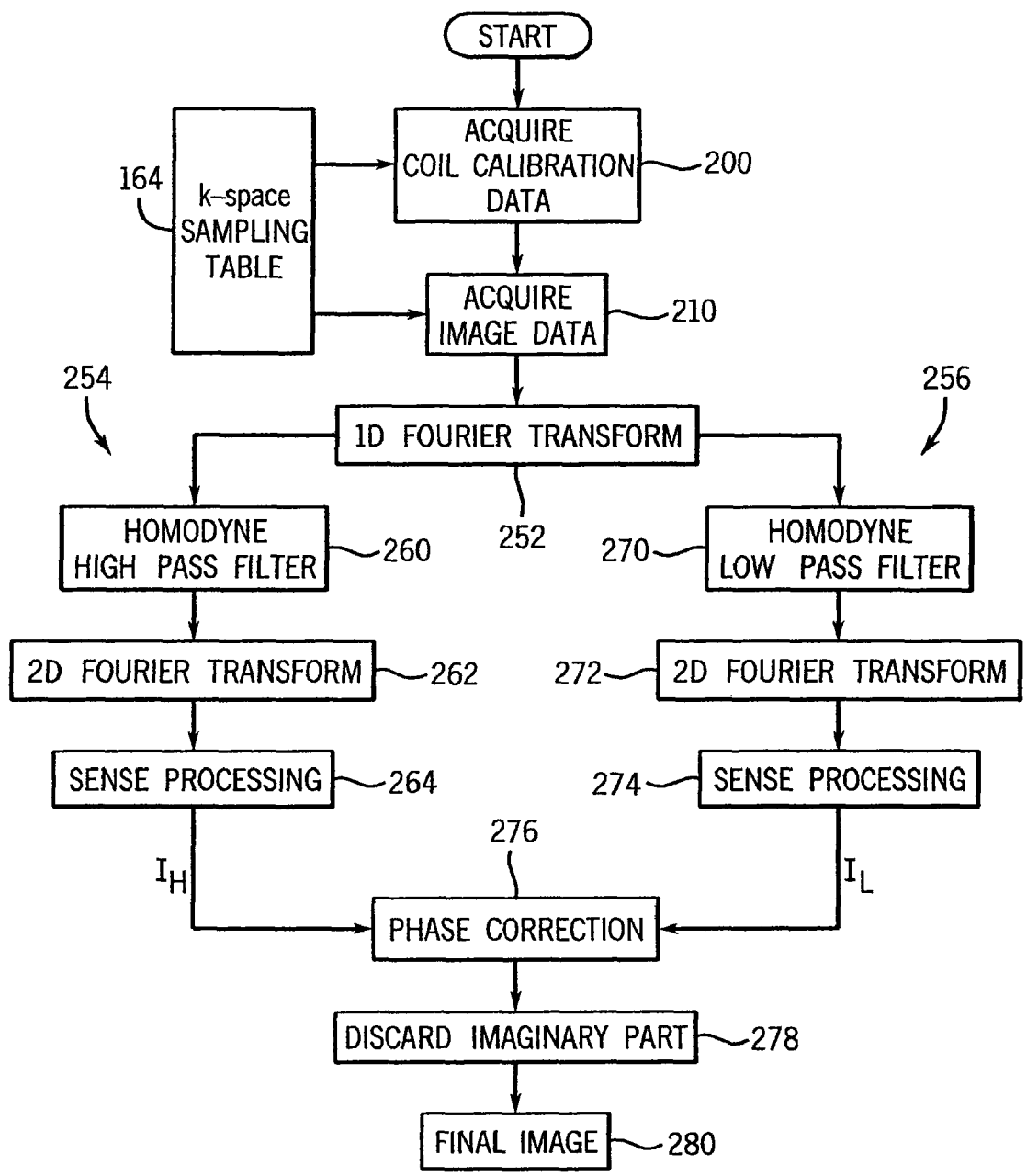
FIG. 7 is a flow chart of the steps in the preferred method for acquiring and reconstructing images using the k-space sampling pattern of FIG. 6.
Figure 8:
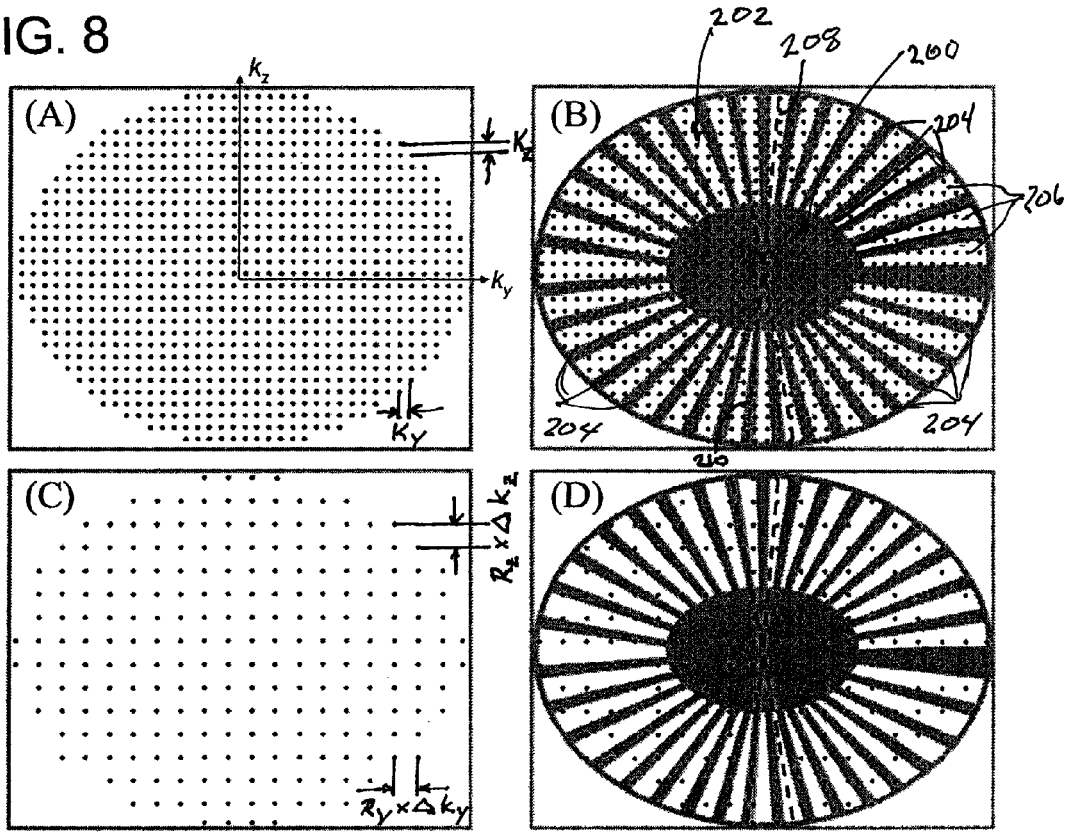
FIG. 8A pictorially shows k-space acquisition for conventional elliptical centric (EC) view order.
FIG. 8B pictorially shows k-space acquisition with the addition of 2D homodyne reconstruction, anti-symmetric sampling in the outer annular zone.
FIG. 8C pictorially shows k-space acquisition for EC with 2D SENSE.
FIG. 8D pictorially shows k-space acquisition for EC with 2D-SENSE and 2D-homodyne.
Figure 9:
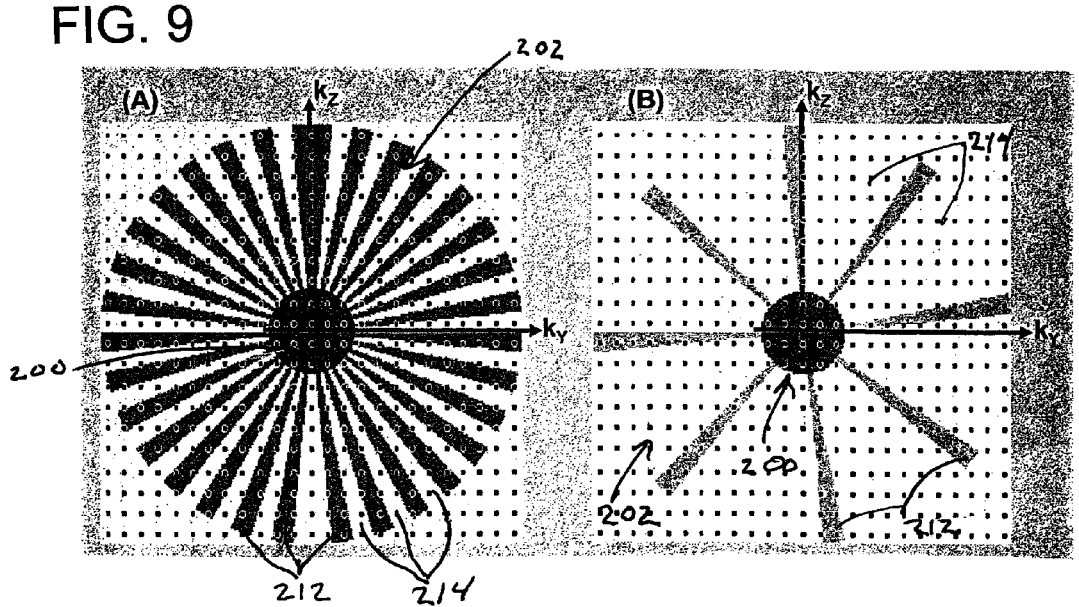
FIGS. 9A and 9B show a pictorial comparison of sampling pattern between two-fold undersampling of vanes in the annular region and an increased degree of undersampling.

The sampled radial sectors 156 are conjugates of corresponding unsampled sectors of k-space. For example, the radial sector 156 indicated by dashed line 160 samples in positive $k_z$ and negative $k_y$ space and its corresponding conjugate sector is unsampled. Similarly, the sampled sector indicated by dashed line 162 samples in negative $k_z$ and $k_y$ space and its conjugate radial sector is unsampled. The sampled radial sectors 156 are thus asymmetrical. The location and order that the central region 150 and radial sectors 156 are sampled is stored in a k-space sampling table 164 as shown in FIG. 7. While a particular sampling order is preferred for this particular clinical application, it will be apparent to those skilled in the art that other sampling orders may be preferred for other clinical applications and stored in the sampling table 164.

Figure 6:
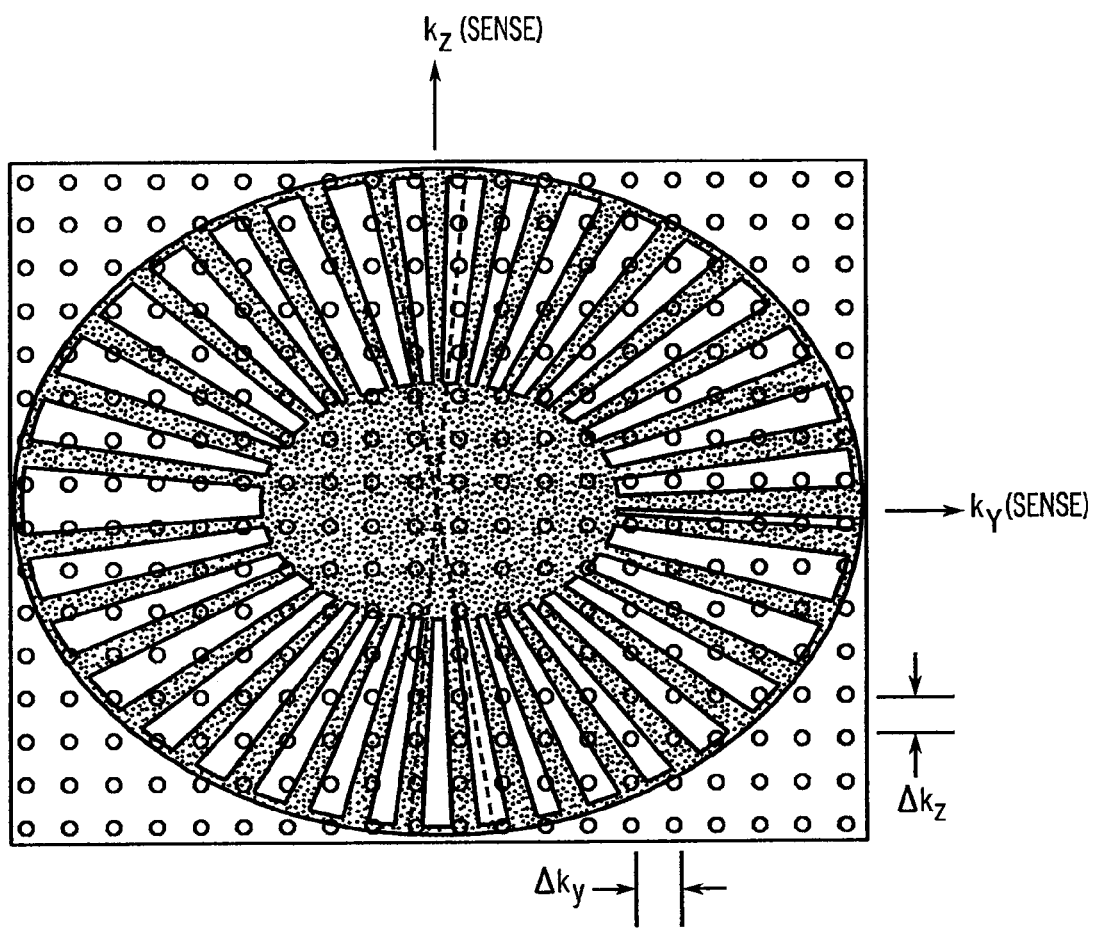
FIG. 6 is a graphic representation of the preferred k-space sampling pattern acquired using a SENSE acquisition.

In addition to the above k-space undersampling pattern, a further reduction in the number of phase encoding views along the $k_z$-$k_y$ axes is achieved using a 2D SENSE acquisition. As shown in FIG. 6, a four-fold SENSE-encoded acquisition with R=2 along each of the phase encoding axes is illustrated. This is illustrated in FIG. 6 by the two-fold increase in sampling intervals $\Delta k_y$ and $\Delta k_z$ compared to the sampling intervals in the acquisition of FIG. 5. The k-space sampling pattern is unchanged from that shown in FIG. 5, but the sampling density is reduced throughout the sampling pattern.

Modifications can be made to accommodate more sampling points if it is desired to offset some of the SNR loss experienced when these undersampling techniques are employed. The additional sample points may be used to enlarge the fully sampled central region 150, or they can be distributed to the outer k-space annulus to widen several sectors 156 and provide additional high-spatial frequency information. In the preferred embodiment 58% of the sample points are acquired during the scan.

Referring particularly to FIG. 7, an MR image is acquired using the k-space sampling table 164 that lists the views that are to be acquired. Because the method employs SENSE, the first step indicated at process block 200 is to acquire calibration data from which sensitivity profiles for each of the four separate coils can be produced. To ensure that the coil sensitivity maps accurately reflect their SENSE-aliased counterparts, the k-space that is acquired for the calibration is the same as that acquired for the images. The calibration acquisition 200, therefore, employs the k-space sampling table 164. A 3D gradient-recalled echo pulse sequence with TR/TE=15/3 ms, flip angle=10°, and a receive bandwidth=±31.25 kHz is used to acquire the calibration data. The sensitivity profiles of individual coils are obtained by normalization with a sum-of-squares combination and the resolution of the acquired calibration images are two-fold coarser than that of the images to be acquired.

As indicated at process block 210, the next step is to acquire the image data. The above-described pulse sequence is used and its two phase encoding gradients are stepped through values to sample the successive k-space sample points listed in the k-space sampling table 164. More specifically, the central region 150 is sampled first in an elliptical centric view order, and then the radial sectors 156 are sampled. The radial sectors 156 are also sampled in an elliptical centric view order in which the k-space sample point in the radial sectors 156 closest to the center of k-space is sampled first.

While a single image may be acquired, typically the present invention is used when multiple images are to be acquired at a high temporal resolution. For example, the method may be employed in a moving table MRA examination of the lower extremities where a high image acquisition rate is needed to follow the contrast bolus down through the legs. Or, it may be used in a dynamic CEMRA study where a high image acquisition rate is needed to see the inflow of contrast agent into vasculature of interest. The image acquisition step 210 will vary, therefore, depending on the particular clinical objective, but in all cases the image data is acquired with the 2D SENSE coils according to the sampling order stored in the k-space sampling table 164. Four k-space image data sets are thus acquired for each image acquisition, one for each coil element. If coil arrays having more elements are used, such as 8, 16 or 32, then a corresponding number of k-space image data sets are acquired.

Each set of four k-space data sets is processed as will now be described to produce a single reconstructed 3D image. If multiple images are acquired during step 210, then this reconstruction process is repeated for each corresponding set of four k-space image data sets. Further processing may also be performed after image reconstruction, such as subtraction of a mask image from one or more contrast enhanced images.

Referring still to FIG. 7, the first step in the image reconstruction process is to perform a one-dimensional Fourier transformation of the four acquired 3D k-space image data sets along the readout axis (x-axis in the preferred embodiment) as indicated at process block 252. One copy of each Fourier transformed data set is processed in a series of steps indicated at branch 254 and a second copy of each is processed in a series of steps indicated at branch 256. These two separate processes are required by the homodyne reconstruction method. In branch 254 the missing k-space data in the peripheral k-space region is produced, and in the branch 256 phase data is produced which is required to correct errors in the missing data produced in branch 254.

The first step in branch 254 is to high pass filter the four data sets as indicated at process block 260. More specifically, this includes filling in the unsampled k-space peripheral locations with the samples acquired at their complex conjugate locations, and then doubling the amplitude of all samples outside the elliptical central region 150. A two-dimensional, complex Fourier transformation is then performed on this complete data set as indicated at process block 262. This 2DFT is performed along the two phase encoding axes (y and z in the preferred embodiment). The result is four complete 3D image data sets which contain phase errors caused by the homodyne high pass filter process 260.

As indicated by process block 264, the next step is to employ the SENSE process to calculate a single image using the four filled images reconstructed above. The SENSE unfolding is well known to those skilled in the art and the method employed in the preferred embodiment is described in Pruessmann K P, Weiger M, Scheidegger M B, Boesiger P. "SENSE: Sensitivity Encoding For Fast MRI," Magn. Reson. Med. 1999; 42:952-962. As a result of the SENSE processing 264, a single high pass image $I_H$ produced in which aliasing artifacts along the two phase encoding axes have been removed. However, as discussed above, this image $I_H$ contains phase errors due to the homodyne filter.

Referring still to FIG. 7, the removal of the phase errors is accomplished with phase corrections calculated in branch 256. The first step as indicated at process block 270 is to low pass filter the second copy of the four acquired and once Fourier transformed data sets. This filtering is done very simply by setting all points outside the fully-sampled central region 150 to zero. The homodyne low pass filter thus removes all the asymmetrically acquired peripheral k-space samples.

The low pass filtered data in each data set is then Fourier transformed in the two phase encoding directions as indicated at process block 272 to produce four low pass filtered images. The four low pass filtered images are SENSE processed as indicated at process block 274. The SENSE process 274 is identical to the SENSE process 264 described above and a single low pass image $I_L$ is produced. This image $I_L$ contains the phase information needed to correct the high pass image $I_H$.

The phase correction is made to the high pass image $I_H$ at process block 276. This is accomplished by subtracting the phase at each pixel in the low pass filtered image $I_L$ from the phase of the corresponding pixel in the high pass image $I_H$. The resulting complex image includes a real and an imaginary component at each pixel location, and the imaginary components are discarded at process block 278. The result is a final image 280 comprised of the real components.

The above-described method for acquiring MR data can be further modified. The modification can be described by comparing it with reference to FIGS. 8A-9B. To be consistent with the description above, all plots assume a 3DFT acquisition and show the sampling pattern in $k_Y$ (horizontal axis) vs. $k_Z$ (vertical axis) coordinates. Slab selection in general is along the Z direction. The readout direction ($k_X$) goes into and out of the page. Each repetition of the acquisition corresponds to an individual point in these figures.

Again, as described above, when conducting an MRA scan, patterns are typically read out in the elliptical centric (EC) view order in which the phase encode views are sampled in accordance with their distance from the $k_Y$-$k_Z$ origin. The spacing between points along the $k_Y$ and $k_Z$ directions in FIGS. 8A and 8B are $\Delta k_Y$ and $\Delta k_Z$, respectively. When SENSE acquisition is performed, as assumed in FIGS. 8C and 8D, these spacings are increased to $R_Y \times \Delta k_Y$ and $R_Z \times \Delta k_Z$ where $R_Y$ and $R_Z$ are defined as the SENSE acceleration factors along the Y and Z directions, respectively. The spacings between k-space points are equal to the reciprocal of the corresponding fields-of-view (FOV). Although not required, often the phase encoding plane shown corresponds to an axial plane of the subject: Y is left-right (L/R), Z is anterior-posterior (A/P), and X is superior/inferior (S/I).

The pattern in FIG. 8A is shown as a reference of 3DFT sampling. The corners are cut out because, for a given acquisition time, it is preferable to sample at increasing radii in k-space and maintain isotropic behavior within the Y-Z plane. The pattern in FIG. 8B applies undersampling and 2D homodyne processing to the reference pattern of 8A. This makes use of Partial Fourier imaging or homodyne (HD) processing. With this process, except for a central zone 200, which is fully sampled, data in a periphery 202 is asymmetrically sampled in k-space. That is, if point $(+k_Y,+k_Z)$ is sampled, then $(-k_Y,-k_Z)$ is not. In FIG. 5B a plurality of annular blades or "vanes" 204 are illustrated and correspond to areas in which the underlying points are sampled. Thus, a plurality of gaps 206 are created where the points are not sampled.

As described above, the reconstruction is done by first performing a low resolution reconstruction using only data from the central zone 200, which is fully sampled, to estimate the phase map across the image. Next, the full data set is reconstructed, but first by weighting the sampled data in the annulus by two-fold to account for the undersampling in that region. Next, the phase of the full reconstruction is corrected using the phase of the low resolution reconstruction, and the final image is taken as the real part of the high resolution reconstruction.

The pattern in FIG. 8B can be characterized by several parameters. First, the size of the central zone 200, which is fully sampled is one characteristic feature. The second characteristic feature is the degree of undersampling in the annular or peripheral zone 202. Third, the size and shape of the blades or vanes 204 also serve as characteristic features. With the assumption of 2D homodyne processing, the undersampling in the annular zone 202 is limited to two-old. First, the vanes 204 through the annular zone 202 are sampled asymmetrically. For example, a vane 208 at the twelve o'clock position is not sampled in FIG. 5B, but an opposing vane 210 at the six o'clock position is sampled.

Turning now to FIGS. 8C and 8d, FIG. 8C shows the sampling pattern of FIG. 8A modified using the SENSE parallel acquisition technique applied along both phase encoding directions. Also, FIG. 8D shows the sampling pattern when the 2D homodyne pattern of FIG. 8B is combined with 2D SENSE of FIG. 8C. Again, only points within the shaded regions are sampled, but owing to the reduced sampling density of 2D SENSE and the unsampled vanes for 2D homodyne, the degree of reduced sampling compared to FIG. 5A can be substantial.

The sampling pattern of FIG. 8D can be used with 2D SENSE with accelerations in the range of R=4 to 8 as well as with 2D homodyne accelerations as high as 1.9, resulting in a net acceleration $R_{net}$=15. With these methods, any points in the underlying two-dimensional grid are in effect estimated deterministically either from the homodyne process or from the SENSE inversion. Although net accelerations this high can be effective, in some instances it may be desirable to have even higher net acceleration and even smaller acquisition times.

The present invention allows for additional undersampling to be done by using a vane pattern that is more sparse. Referring to FIG. 9A, a different version of the SENSE pattern of FIG. 8D is shown. Specifically, vanes 212 in the peripheral or annular region 202 spans the entire 2π radians and the degree of undersampling is exactly two-fold. In this regard, gaps 214 are created between the vanes 212 that, again, are not sampled. However, the gaps 214 exactly matches the area occupied by the sampled vanes 212 themselves.

Referring to FIG. 9B, a further improved technique can be illustrated. In this case, every fourth vane 212 of FIG. 9A is sampled. However, the vanes of FIG. 9A are now excluded from sampling. As such, the degree of undersampling is increased by four-fold in sampling pattern shown in FIG. 9B as opposed to that shown in FIG. 9A, and the acquisition time is correspondingly decreased by this factor.

To this end, this technique exploits properties traditionally thought of as being reserved for projection reconstruction (PR), which is known to have some resilience or immunity to artifacts due to undersampling of the requisite number of projections. However, the acquisition is not projection reconstruction, but is rather Cartesian. The PR pattern is simply superimposed onto the phase encoding $k_y$-$k_z$ plane but with the sampling assigned to the evenly spaced underlying grid. This latter effect reduces excessive and inefficient oversampling of the k-space center and also allows easy and direct image reconstruction using Fast Fourier Transform (FFT). Furthermore, quite unexpectedly, the method of the present invention yields images that having reduced "star-like" undersampling artifacts over those using PR at high parallel imaging accelerations. That is, unlike images produced from undersampled PR acquisitions using parallel imaging that have well-known "star-like" or "star-shaped" artifacts dispersed through the image due to the undersampled data and that increase with the amount of undersampling, "star-like" artifacts induced in images reconstructed using the present invention tend to unexpectedly decrease with increased acceleration. Further advantageously, using the present method, the sharpness in portraying the leading edge of the contrast bolus improves as the degree of undersampling increases.

Further still, the overall image quality is comparable with one-dimensional or two-dimensional parallel acquisitions.

The basic sampling pattern can be further modified and the data reconstructed in various ways. Specifically, the level of undersampling was increased fourfold between FIGS. 9A and 9B. Factors larger or smaller than this can be useful depending upon the tradeoff between desired acquisition time and the degree of any undersampling artifact. For the reconstruction of the undersampled set in FIG. 9B, it may be desirable to weight the acquired data in the annular region by the numerical factor by which the undersampling is done, four-fold in this example. This preserves the relative signal power in all regions of k-space. Finally, the pattern in FIG. 5B can be repeated over time to generate a time series of 3D image data sets. In this case, the same undersampling pattern might be used from image to image or interleaved undersampled vane sets can be acquired. The latter allows the data from consecutive image data sets to be combined for less undersampling and less artifact.

The present invention has been described in terms of one or more embodiments, and it should be appreciated that many equivalents, alternatives, variations, and modifications, aside from those expressly stated, are possible and within the scope of the invention.

The invention claimed is:

1. A method for producing an image with a magnetic resonance imaging (MRI) system, the steps comprising:
    a) arranging a three-dimensional (3D) k-space along a Cartesian grid of points;
    b) dividing k-space into a central region of k-space and a peripheral region of k-space;
    c) selecting points in k-space within a plurality of radial vanes that extend radially outward from the central region of k-space through the peripheral region of k-space as viewed in a plane sampled by two phase encoding gradients to create a plurality of gaps between the radial vanes that is substantially a factor of N times greater in area than the radial vanes;
    d) acquiring, with an MRI system having arrays of RF receiver coils, NMR signals from a subject to fully sample the central region of the 3D k-space and undersample the peripheral region of k-space by only sampling k-space within the plurality of radial vanes; and
    e) reconstructing an imaging of the subject using the acquired NMR signals.

2. The method of claim 1 wherein the radial vanes distributed substantially evenly around the central region of k-space.

3. The method of claim 1 wherein step e) further includes employing a homodyne image reconstruction process.

4. The method of claim 1 wherein the radial vanes are asymmetrical.

5. The method of claim 1 wherein step e) includes employing image a Fast Fourier Transform to reconstruct the image of the subject.

6. The method of claim 1 wherein the factor of N equals four.

7. The method of claim 1 wherein step e) includes weighting data in the annular vanes by the factor of N.

8. The method of claim 1 further comprising repeating steps a) through e) to generate a time series of 3D image data sets.

9. The method of claim 8 wherein a position of the radial vanes are adjusted between each of the time series of 3D image data sets.

10. The method of claim 9 wherein step e) includes combining data from consecutive image data sets in the time series of 3D image data sets.

* * * * *